United States Patent
Koto et al.

(10) Patent No.: US 8,410,826 B2
(45) Date of Patent: Apr. 2, 2013

(54) LOAD DRIVE CIRCUIT WITH CURRENT BIDIRECTIONAL DETECTING FUNCTION

(75) Inventors: Masaaki Koto, Osaka (JP); Naoyuki Nakamura, Kyoto (KR); Hiroyuki Miyachi, Kyoto (JP)

(73) Assignee: Panasonic Corporation, Osaka (JP)

( * ) Notice: Subject to any disclaimer, the term of this patent is extended or adjusted under 35 U.S.C. 154(b) by 73 days.

(21) Appl. No.: 13/074,937

(22) Filed: Mar. 29, 2011

(65) Prior Publication Data
US 2011/0248748 A1    Oct. 13, 2011

(30) Foreign Application Priority Data
Apr. 9, 2010  (JP) ................................. 2010-090408

(51) Int. Cl.
*H03B 1/00* (2006.01)
*H03K 3/00* (2006.01)
(52) U.S. Cl. .................... 327/108; 327/110; 327/111
(58) Field of Classification Search .............. 327/108, 327/110, 111
See application file for complete search history.

(56) References Cited

U.S. PATENT DOCUMENTS

| | | | |
|---|---|---|---|
| 5,977,751 A | 11/1999 | Blessing et al. | |
| 6,694,095 B2 * | 2/2004 | Kohno | 396/48 |
| 6,977,513 B2 | 12/2005 | Matsunaga | |

FOREIGN PATENT DOCUMENTS
JP          64-083156         3/1989

* cited by examiner

*Primary Examiner* — John Poos
(74) *Attorney, Agent, or Firm* — McDermott Will & Emery LLP

(57) ABSTRACT

A load drive circuit with a current bidirectional detecting function includes: a current bidirectional switch connected between a first wire and a second wire and through which a first forward current flows in a direction from the first wire to the second wire and a first backward current flows in a direction from the second wire to the first wire; a forward current detecting switch connected to the first wire and into which a second forward current correlated to the first forward current flowing through the current bidirectional switch flows; a backward current detecting switch connected to the second wire and into which a second backward current correlated to the first backward current flowing through the current bidirectional switch flows.

6 Claims, 10 Drawing Sheets

LOAD DRIVE CIRCUIT WITH CURRENT BIDIRECTIONAL DETECTING FUNCTION

RELATED APPLICATIONS

The disclosure of Japanese Patent Application No. 2010-090408 filed on Apr. 9, 2010 including specification, drawings and claims is incorporated herein by reference in its entirety.

BACKGROUND ART

1. Field of the Invention

The present invention relates to a load drive circuit with a current bidirectional detecting function.

2. Description of the Related Art

A current loop of a load drive circuit configured to unidirectionally supply a current from a DC power supply to a load to drive the load is typically provided with a switching element configured to control the current supplied to the load. In addition, since it is necessary to detect and monitor the current flowing through the switching element to the load for the purpose of overcurrent protection of the switching element, the load drive circuit has a function of detecting the current flowing to the load.

For example, Japanese Laid-Open Patent Application Publication No. 1989-83156 describes that chopper control is carried out by a field-effect transistor (hereinafter referred to as a "FET") as the switching element in a chopper control system of a DC electric motor applied to an electrically-assisted power steering system of an automobile. Moreover, FIG. 1 of Japanese Laid-Open Patent Application Publication No. 1989-83156 discloses the configuration of a current detecting circuit configured to detect the current flowing to the DC electric motor (load). Hereinafter, a conventional load drive circuit with a unidirectional current detecting function shown in FIG. 10 that is FIG. 1 of Japanese Laid-Open Patent Application Publication No. 1989-83156 will be explained.

The conventional load drive circuit with the unidirectional current detecting function shown in FIG. 10 carries out the chopper control of a load 52 based on a chopper control FET (hereinafter referred to as a "main FET") 53. The load 52 is constituted by a DC electric motor driven by a DC power supply wire 51, such as a battery. The main FET 53 is turned on and off by a gate signal supplied from a control device, not shown. Moreover, the conventional load drive circuit with the unidirectional current detecting function shown in FIG. 10 operates such that a current detecting FET (hereinafter referred to as a "sub FET") 54 detects a current $I_1$ which flows during the chopper control of the load 52. Specifically, the sub FET 54 is turned on and off at the same time as the main FET 53 by the gate signal supplied to the main FET 53. Moreover, a differential amplifier 55 operates to supply a source current $I_2$ of a predetermined value to the sub FET 54 such that a source voltage $V_1$ of the main FET 53 applied to a non-inverted input terminal and a source voltage $V_2$ of the sub FET 54 applied to an inverted input terminal become equal to each other.

Here, if an ON resistance of the main FET 53 is (1/n) times an ON resistance of the sub FET 54, the relation between the current $I_1$ flowing through the main FET 53 and the current $I_2$ flowing through the sub FET 54 is shown by the following formula.

$$I_2 = (1/n) \cdot I_1 \qquad (1)$$

Moreover, in a case where a resistance value of a resistor 56 is denoted by R, and a voltage drop of the resistor 56 is denoted by $V_1$, the relation between $V_1$ and $I_2$ is shown by the following formula.

$$V_1 = R \cdot I_2 \qquad (2)$$

Therefore, based on Formulas (1) and (2), the relation between $V_1$ and $I_1$ is shown by the following formula.

$$V_1 = (1/n) \cdot R \cdot I_1 \qquad (3)$$

It is clear from Formula (3) that the current $I_1$ flowing to the load 52 can be indirectly detected by detecting the voltage drop $V_I$ of the resistor 56. Moreover, when the voltage drop $V_I$ of the resistor 56 exceeds a predetermined threshold Vth, that is, when the current $I_1$ corresponding to the voltage drop $V_I$ exceeds a threshold Ith shown by Formula (4) below, the overcurrent protection is realized, that is, the main FET 53 is forcibly turned off.

$$Ith = n \cdot (Vth/R) \qquad (4)$$

SUMMARY OF THE INVENTION

AC-AC electric power converters, such as matrix converters, have been attracting attention in recent years. A semiconductor switching element used in the AC-AC electric power converter needs to allow a current to bidirectionally flow therethrough and withstand a high voltage applied from an AC commercial power supply. Further, for safety reasons, the semiconductor switching element of the AC-AC electric power converter needs to be protected from overcurrent.

A low withstand voltage FET (for example, a gallium arsenide (GaAs) base) adopts a symmetrical configuration in which a drain electrode and a source electrode are not distinguished from each other. In contrast, an extremely higher gate voltage than a voltage applied to the low withstand voltage FET is applied to a gate electrode of a high withstand voltage FET (power FET) designed for a power electronics field, so that problems occur regarding the withstand voltage between the gate and the source. For example, in a case where the voltage of the power supply is 600 V, the gate voltage of 600 V that is the upper limit may be applied to the gate electrode (full swing). However, since the voltage between the gate and the source is normally 5 V at most, the withstand voltage between the gate and the source is not enough. On this account, to apply the extremely high gate voltage to the gate electrode, the high withstand voltage FET adopts an asymmetrical configuration in which the drain electrode and the source electrode are distinguished from each other.

However, in the FET having the asymmetrical configuration, the current can flow in a single direction (for example, a direction from the drain electrode to the source electrode). On this account, the FET having the asymmetrical configuration cannot be adopted as a switch (hereinafter referred to as a "current bidirectional switch") capable of bidirectionally switching currents flowing between one main terminal and the other main terminal except for a control terminal. One example of the current bidirectional switch is an AC switch of the matrix converter configured to convert an AC node voltage (voltage) into an AC output voltage having a desired magnitude and frequency.

Japanese Laid-Open Patent Application Publication No. 1989-83156 does not especially describe the configuration of the main FET 53 shown in FIG. 10. However, even if the main FET 53 has the asymmetrical configuration and the DC power supply wire 51 is replaced with an AC power supply, the main FET 53 does not serve as the current bidirectional switch.

Therefore, a current detecting circuit constituted by the sub FET 54, the differential amplifier 55, and the resistor 56 shown in FIG. 10 just detects a unidirectional current as the source current $I_2$ flowing through the sub FET 54 and corresponding to the source current $I_1$ flowing through the main FET 53 and cannot detect bidirectionally-flowing currents to activate the overcurrent protection.

The present invention was made to solve the above conventional problems, and an object of the present invention is to provide a load drive circuit including a current bidirectional switch capable of bidirectionally switching the direction of a current supplied to a load and a current bidirectional detecting function capable of detecting the currents bidirectionally flowing through the current bidirectional switch.

To solve the above problems, a load drive circuit with a current bidirectional detecting function according to the present invention includes: a current bidirectional switch connected between a first wire and a second wire, the first wire being connected to one of a power supply and a load, the second wire being connected to the other one of the power supply and the load, the current bidirectional switch being configured to carry out switching to allow a first forward current or a first backward current to flow therethrough, the first forward current flowing in a direction (hereinafter referred to as a forward direction) from the first wire to the second wire, the first backward current flowing in a direction (hereinafter referred to as a backward direction) from the second wire to the first wire; a forward current detecting switch connected to the first wire and through which a second forward current correlated to the first forward current flowing through the current bidirectional switch flows; a backward current detecting switch connected to the second wire and through which a second backward current correlated to the first backward current flowing through the current bidirectional switch flows; a forward current detecting circuit connected to the forward current detecting switch and through which the second forward current flowing through the forward current detecting switch flows, the forward current detecting circuit being configured to detect the second forward current; a backward current detecting circuit connected to the backward current detecting switch and through which the second backward current flowing through the backward current detecting switch flows, the backward current detecting circuit being configured to detect the second backward current; and a switch control circuit configured to control the switching of the current bidirectional switch, switching of the forward current detecting switch, and switching of the backward current detecting switch such that the first forward current flowing through the current bidirectional switch and the second forward current flowing through the forward current detecting switch flow at the same time, and the first backward current flowing through the current bidirectional switch and the second backward current flowing through the backward current detecting switch flow at the same time.

In accordance with this configuration, in the load drive circuit including the current bidirectional switch capable of bidirectionally switching the direction of the current supplied to the load, the current bidirectional detecting function capable of detecting the currents bidirectionally flowing through the current bidirectional switch can be realized.

In the load drive circuit with the current bidirectional detecting function, the current bidirectional switch may be a first four-terminal field-effect transistor including a first main terminal connected to the first wire, a second main terminal connected to the second wire, a first control terminal to which a first control voltage is applied from the switch control circuit, and a second control terminal to which a second control voltage is applied from the switch control circuit, the forward current detecting switch may be a second four-terminal field-effect transistor including a first main terminal connected to the first wire, a second main terminal connected to the forward current detecting circuit, a first control terminal to which the first control voltage is applied from the switch control circuit, and a second control terminal to which the second control voltage is applied from the switch control circuit, and the backward current detecting switch may be a third four-terminal field-effect transistor including a first main terminal connected to the backward current detecting circuit, a second main terminal connected to the second wire, a first control terminal to which the first control voltage is applied from the switch control circuit, and a second control terminal to which the second control voltage is applied from the switch control circuit.

In accordance with this configuration, each of the current bidirectional switch, the forward current detecting switch, and the backward current detecting switch can be used as a high-power switching element (power FET) having low loss (low ON resistance) and high withstand voltage.

In the load drive circuit with the current bidirectional detecting function, the current bidirectional switch may include: a first three-terminal field-effect transistor having a first main terminal, a second main terminal connected to the first wire, and a single control terminal to which a first control voltage is applied from the switch control circuit; and a second three-terminal field-effect transistor having a first main terminal connected to the first main terminal of the first three-terminal field-effect transistor, a second main terminal connected to the second wire, and a single control terminal to which a second control voltage is applied from the switch control circuit, the forward current detecting switch may include: a third three-terminal field-effect transistor having a first main terminal, a second main terminal connected to the first wire, and a single control terminal to which the first control voltage is applied from the switch control circuit; and a fourth three-terminal field-effect transistor having a first main terminal connected to the first main terminal of the third three-terminal field-effect transistor, a second main terminal connected to the forward current detecting circuit, and a single control terminal to which the second control voltage is applied from the switch control circuit, and the backward current detecting switch may include: a fifth three-terminal field-effect transistor having a first main terminal, a second main terminal connected to the backward current detecting circuit, and a single control terminal to which the first control voltage is applied from the switch control circuit; and a sixth three-terminal field-effect transistor having a first main terminal connected to the first main terminal of the fifth three-terminal field-effect transistor, a second main terminal connected to the second wire, and a single control terminal to which the second control voltage is applied from the switch control circuit.

In accordance with this configuration, each of the current bidirectional switch, the forward current detecting switch, and the backward current detecting switch can be used as a high-power switching element (power FET) having low loss (low ON resistance) and high withstand voltage.

In the load drive circuit with the current bidirectional detecting function, each of the current bidirectional switch, the forward current detecting switch, and the backward current detecting switch may be constituted by a gallium nitride (GaN) transistor.

In accordance with this configuration, it is possible to realize lower loss and higher withstand voltage of the field-effect transistor constituting each of the current bidirectional switch, the forward current detecting switch, and the backward current detecting switch.

In the load drive circuit with the current bidirectional detecting function, the forward current detecting circuit may include: a first differential amplifier having a non-inverted input terminal to which a voltage of the second wire is applied, an inverted input terminal to which a first node voltage between the forward current detecting switch and the forward current detecting circuit is applied, and a first output terminal from which a first output current flows out, the first output current causing the voltage of the second wire and the first node voltage to be equal to each other; and a first current detector provided between the output terminal and inverted input terminal of the first differential amplifier to detect the first output current correlated to the second forward current, and the backward current detecting circuit may include: a second differential amplifier having a non-inverted input terminal to which a voltage of the first wire is applied, an inverted input terminal to which a second node voltage between the backward current detecting switch and the backward current detecting circuit is applied, and an output terminal from which a second output current flows out, the second output current causing the voltage of the first wire and the second node voltage to be equal to each other; and a second current detector provided between the output terminal and inverted input terminal of the second differential amplifier to detect the second output current correlated to the second backward current.

In accordance with this configuration, the forward current detecting circuit and the backward current detecting circuit can be realized appropriately.

In accordance with the present invention, it is possible to realize the load drive circuit including: the current bidirectional switch capable of bidirectionally switching the direction of the current supplied to the load and the current bidirectional detecting function capable of detecting the currents bidirectionally flowing through the current bidirectional switch.

DETAILED DESCRIPTION OF PREFERRED EMBODIMENTS

Hereinafter, preferred embodiments of the present invention will be explained in reference to the drawings. In the following explanation and the drawings, the same reference signs are used for the same or corresponding components, and a repetition of the same explanation is avoided.

Concept of Present Invention

First, the concept of the present invention will be explained in reference to FIG. 1.

Figure 1:
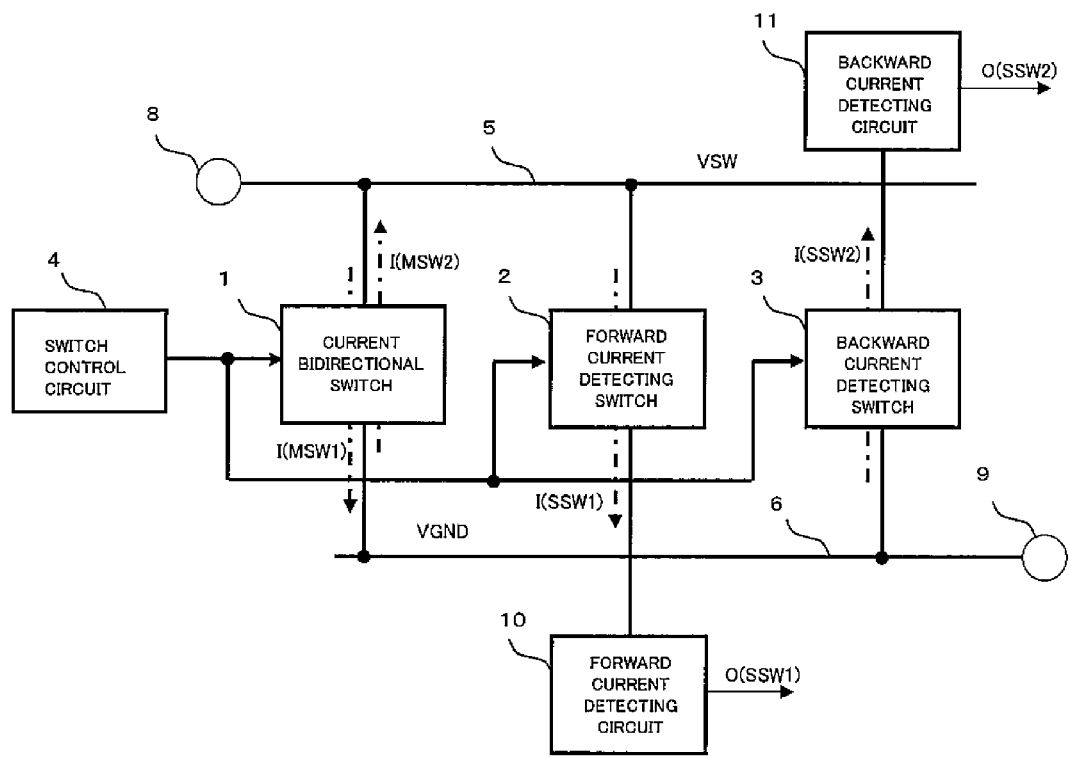
FIG. 1 is a circuit diagram showing the configuration of a load drive circuit with a current bidirectional detecting function according to the present invention.

FIG. 1 is a circuit diagram showing the configuration of a load drive circuit with a current bidirectional detecting function according to the present invention. The load drive circuit with the current bidirectional detecting function shown in FIG. 1 includes a current bidirectional switch 1, a forward current detecting switch 2, a backward current detecting switch 3, a switch control circuit 4, a first wire 5 connected to a power supply 8 and to which an AC voltage is supplied from the power supply 8, a second wire 6 connected to a load 9 and through which the AC voltage is supplied to the load 9, a forward current detecting circuit 10, and a backward current detecting circuit 11. The first wire 5 may be connected to the load 9, and the second wire 6 may be connected to the power supply 8.

In FIG. 1, I(MSW1) denotes a forward current (first forward current in the present invention) flowing through the current bidirectional switch 1 in a direction (hereinafter referred to as a "forward direction", for convenience sake) from the first wire 5 to the second wire 6, I(MSW2) denotes a backward current (first backward current in the present invention) flowing through the current bidirectional switch 1 in a direction (hereinafter referred to as a "backward direction", for convenience sake) from the second wire 6 to the first wire 5, I(SSW1) denotes a forward current (second forward current in the present invention) correlated to I(MSW1) and flowing from the first wire 5 through the forward current detecting switch 2, I(SSW2) denotes a backward current (second backward current in the present invention) correlated to I(MSW2) and flowing from the second wire 6 through the backward current detecting switch 3, O(SSW1) denotes a forward current detection signal of the forward current detecting circuit 10, and O(SSW2) denotes a backward current detection signal of the backward current detecting circuit 11. Hereinafter, explanations will be made based on the forward and backward directions defined as above. However, the direction of the current from the second wire 6 to the first wire 5 may be the forward direction, and the direction of the current from the first wire 5 to the second wire 6 may be the backward direction.

The current bidirectional switch 1 is connected between the first wire 5 connected to the power supply 8 and the second wire 6 connected to the load 9. The current bidirectional switch 1 switches between the forward current I(MSW1) flowing in the forward direction from the first wire 5 to the second wire 6 and the backward current I(MSW2) flowing in the backward direction from the second wire 6 and the first wire 5 to allow the forward current I(MSW1) or the backward current I(MSW2) to flow therethrough depending on a control voltage output from the switch control circuit 4.

The forward current detecting switch 2 is connected to the first wire 5. The forward current detecting switch 2 allows the forward current I(SSW1) to flow therethrough depending on the control voltage output from the switch control circuit 4. The forward current I(SSW1) is correlated to the forward current I(MSW1) flowing through the current bidirectional switch 1. The correlation between the forward current I(MSW1) flowing through the current bidirectional switch 1 and the forward current I(SSW1) flowing through the forward current detecting switch 2 denotes, for example, a relation in which as one of a current value of the forward current I(MSW1) and a current value of the forward current I(SSW1) increases, the other current value also increases at the same change rate, and similarly, as one of the current values decreases, the other current value also decreases at the same change rate.

The backward current detecting switch 3 is connected to the second wire 6. The backward current detecting switch 3 allows the backward current I(SSW2) to flow therethrough depending on the control voltage output from the switch control circuit 4. The backward current I(SSW2) is correlated to the backward current I(MSW2) flowing through the current bidirectional switch 1. The correlation between the backward current I(MSW2) flowing through the current bidirectional switch 1 and the backward current I(SSW2) flowing through the backward current detecting switch 3 denotes, for example, a relation in which as one of a current value of the backward current I(MSW2) and a current value of the backward current I(SSW2) increases, the other current value also increases at the same change rate, and similarly, as one of the current values decreases, the other current value also decreases at the same change rate.

The forward current detecting circuit 10 is connected to the forward current detecting switch 2. The forward current I(SSW1) flowing out from the forward current detecting switch 2 flows into the forward current detecting circuit 10, and the forward current detecting circuit 10 detects the forward current I(SSW1).

The backward current detecting circuit 11 is connected to the backward current detecting switch 3. The backward current I(SSW2) flowing out from the backward current detecting switch 3 flows into the backward current detecting circuit 11, and the backward current detecting circuit 11 detects the backward current I(SSW2).

The switch control circuit 4 controls the current bidirectional switch 1, the forward current detecting switch 2, and the backward current detecting switch 3 such that the forward current I(MSW1) flowing through the current bidirectional switch 1 and the forward current I(SSW1) flowing through the forward current detecting switch 2 flow at the same time, and the backward current I(MSW2) flowing through the current bidirectional switch 1 and the backward current I(SSW2) flowing through the backward current detecting switch 3 flow at the same time.

Specifically, when the current bidirectional switch 1 is turned on based on the control voltage output from the switch control circuit 4, the forward current I(MSW1) or the backward current I(MSW2) flows through the current bidirectional switch 1 based on a difference voltage (=VSW−VGND) between a voltage VSW of the first wire 5 and a voltage VGND of the second wire 6.

Here, when the forward current I(MSW1) flows through the current bidirectional switch 1, the switch control circuit 4 turns on the forward current detecting switch 2 at the same time as the current bidirectional switch 1 is turned on. As a result, the forward current I(SSW1) flows through the forward current detecting switch 2 at the same time. Since the backward current detecting circuit 11 is configured not to operate in this case, the backward current detecting switch 3 may be turned on or off. Therefore, the forward current detecting circuit 10 can detect the forward current I(SSW1) flowing from the forward current detecting switch 2 to indirectly detect the forward current I(MSW1) flowing through the current bidirectional switch 1. Especially, the overcurrent protection is realized by setting a threshold Ith(SSW1) as the forward current I(SSW1). In this case, when a current Ith (MSW1) proportional to the threshold Ith(SSW1) flows through the current bidirectional switch 1, the overcurrent protection can be activated by the correlation between the forward current I(MSW1) and the forward current I(SSW1).

In contrast, when the current bidirectional switch 1 is turned on to allow the backward current I(MSW2) to flow therethrough, the switch control circuit 4 turns on the backward current detecting switch 3 at the same time as the current bidirectional switch 1 is turned on. As a result, the backward current I(SSW2) also flows through the backward current detecting switch 3. Since the forward current detecting circuit 10 is configured not to operate in this case, the backward current detecting switch 3 may be turned on or off. Therefore, the backward current detecting circuit 11 can detect the backward current I(SSW2) flowing from the backward current detecting switch 3 to indirectly detect the backward current I(MSW2) flowing through the current bidirectional switch 1. Especially, the overcurrent protection is realized by setting a threshold Ith(SSW2) as the backward current I(SSW2). In this case, when a current Ith(MSW2) proportional to the threshold Ith(SSW2) flows through the current bidirectional switch 1, the overcurrent protection can be activated by the correlation between the backward current I(MSW2) and the backward current I(SSW2).

As above, the currents (the forward current I(MSW1) and the backward current I(MSW2)) bidirectionally flowing through the current bidirectional switch 1 can be detected. For example, the thresholds can be set for the currents bidirectionally flowing through the current bidirectional switch 1. As a result, bidirectional overcurrent protection can be realized.

Hereinafter, specific embodiments of the present invention will be explained.

Embodiment 1

Figure 2:
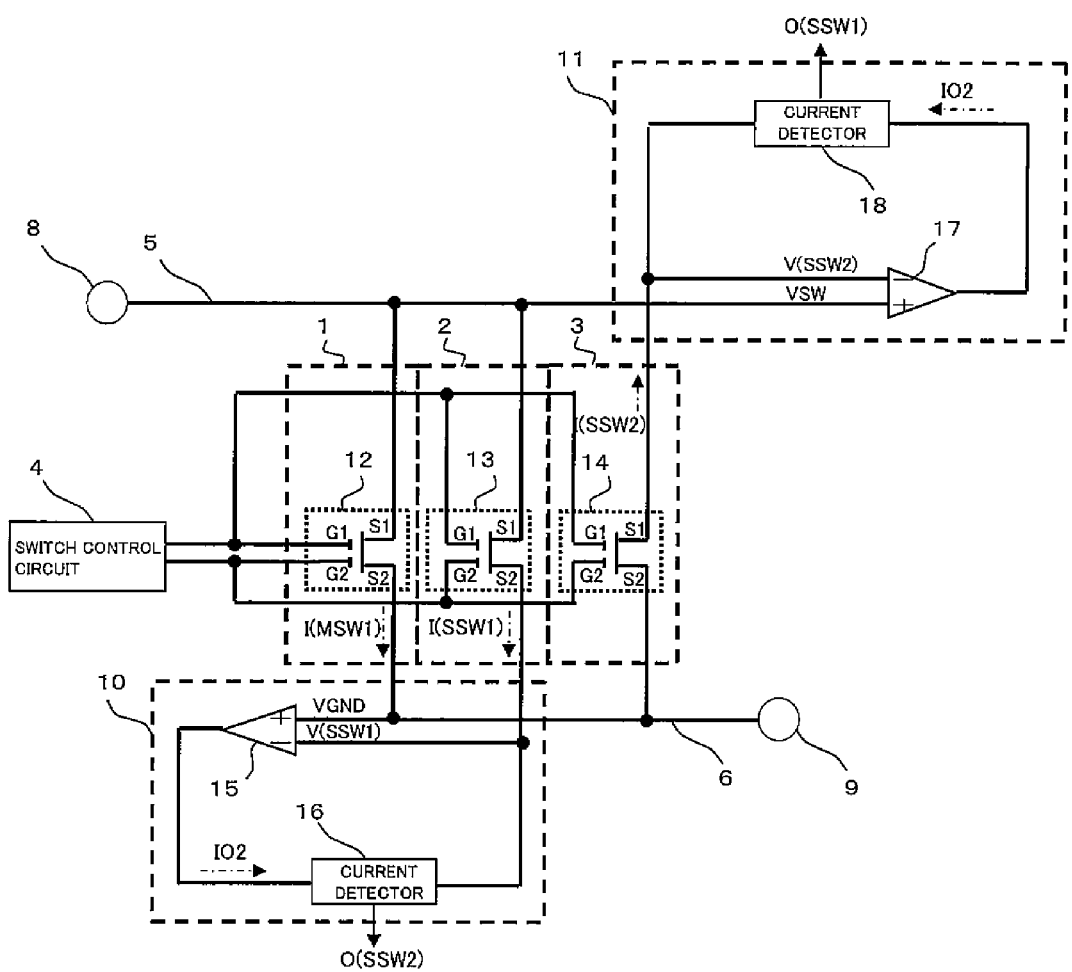
FIG. 2 is a circuit diagram showing the configuration of the load drive circuit with the current bidirectional detecting function according to Embodiment 1 of the present invention.

FIG. 2 is a circuit diagram showing the configuration of the load drive circuit with the current bidirectional detecting function according to Embodiment 1 of the present invention.

The current bidirectional switch 1 is configured as a four-terminal field-effect transistor 12 (first four-terminal field-effect transistor in the present invention) including a main terminal S1 (first main terminal in the present invention) to which the forward current I(MSW1) flows from the first wire 5, a main terminal S2 (second main terminal in the present invention) to which the backward current I(MSW2) flows from the second wire 6, a control terminal G1 (first control terminal in the present invention) to which a control voltage VG1 is applied from the switch control circuit 4, and a control terminal G2 (second control terminal in the present invention) to which a control voltage VG2 is applied from the switch control circuit 4. As above, in the present invention, a terminal (such as a source or drain in a field-effect transistor or an emitter or collector in a bipolar transistor) through which a load current of a transistor flows is called a main terminal, and a terminal (such as a gate in a field-effect transistor or a base in a bipolar transistor) to which a control voltage of a transistor is applied is called a control terminal.

The forward current detecting switch 2 is configured as a four-terminal field-effect transistor 13 (second four-terminal field-effect transistor in the present invention) including a main terminal S1 (third main terminal in the present invention) to which the forward current I(SSW1) flows from the first wire 5, a main terminal S2 (fourth main terminal in the present invention) from which the forward current I(SSW1) flows out toward the forward current detecting circuit 10, a control terminal G1 (third control terminal in the present invention) to which the control voltage VG1 is applied from the switch control circuit 4, and a control terminal G2 (fourth control terminal in the present invention) to which the control voltage VG2 is applied from the switch control circuit 4.

The backward current detecting switch 3 is configured as a four-terminal field-effect transistor 14 (third four-terminal field-effect transistor in the present invention) including a main terminal S1 (fifth main terminal in the present invention) from which the backward current I(SSW2) flows out toward the backward current detecting circuit 11, a main terminal S2 (sixth main terminal in the present invention) to which the backward current I(SSW2) flows from the second wire 6, a control terminal G1 (fifth control terminal in the present invention) to which the control voltage VG1 is applied from the switch control circuit 4, and a control terminal G2 (sixth control terminal in the present invention) to which the control voltage VG2 is applied from the switch control circuit 4.

The forward current detecting circuit 10 is constituted by a differential amplifier 15 (first differential amplifier in the present invention) and a current detector 16 (first current detector in the present invention). The differential amplifier 15 includes a non-inverted input terminal, an inverted input terminal, and an output terminal. The differential amplifier 15 operates such that: the voltage VGND of the second wire 6 is applied to the non-inverted input terminal; a node voltage V(SSW1) of a node between the forward current detecting switch 2 and the forward current detecting circuit 10 (to be exact, a node between the main terminal S2 of the four-terminal field-effect transistor 12 and the current detector 16) is applied to the inverted input terminal; and an output current which causes the voltage VGND of the second wire 6 and the node voltage V(SSW1) to be equal to each other is output from the output terminal by virtual short. The current detector 16 is provided between the output terminal and inverted input terminal of the differential amplifier 15 to detect the output current correlated to the forward current I(SSW1). For example, a resistor, a current sensor, or the like may be adopted as the current detector 16.

The backward current detecting circuit 11 is constituted by a differential amplifier 17 (second differential amplifier in the present invention) and a current detector 18 (second current detector in the present invention). The differential amplifier 17 includes a non-inverted input terminal, an inverted input terminal, and an output terminal. The differential amplifier 17 operates such that: the voltage VSW of the first wire 5 is applied to the non-inverted input terminal; a node voltage V(SSW2) of a node between the backward current detecting switch 3 and the backward current detecting circuit 11 (to be exact, a node between the main terminal S1 of the four-terminal field-effect transistor 14 and the current detector 18) is applied to the inverted input terminal; and an output current which causes the voltage VSW of the first wire 5 and the node voltage V(SSW2) to be equal to each other is output from the output terminal by virtual short. The current detector 18 is provided between the output terminal and inverted input terminal of the differential amplifier 17 to detect the output current correlated to the backward current I(SSW2). For example, a resistor, a current sensor, or the like may be adopted as the current detector 18.

It is preferable that the four-terminal field-effect transistor 12 constituting the current bidirectional switch 1 be constituted by a gallium nitride (GaN) transistor in a case where a large-current and high-voltage operation is required to drive an AC load, such as a below-described incandescent lamp 30, three-phase motor 34, or the like (in a case where the difference voltage between the voltage VSW of the first wire 5 and the voltage VGND of the second wire 6 is high). It is preferable that each of the four-terminal field-effect transistor 13 constituting the forward current detecting switch 2 and the four-terminal field-effect transistor 14 constituting the backward current detecting switch 3 be constituted by a gallium nitride transistor since the control voltages VG1 and VG2 applied to the control terminals G1 and G2 are the same as those in the four-terminal field-effect transistor 12 constituting the current bidirectional switch 1. Gallium nitride is a compound of gallium (Ga) belonging to group-III of a periodic table and nitrogen (N) and is known as a semiconductor whose band gap is electrically large. A material having a larger band gap has a higher withstand voltage. Therefore, the gallium nitride transistor can be utilized as a high-power switching element (power FET) having low loss (low ON resistance) and high withstand voltage.

Moreover, when each of the four-terminal field-effect transistors 12, 13, and 14 is constituted by the gallium nitride transistor, two control terminals G1 and G2 are provided. In this case, by increasing the distance between the control terminals G1 and G2, the withstand voltage between the control terminals G1 and G2 can be set to be higher than the withstand voltage between a gate and source of a conventional FET. Therefore, unlike the asymmetric transistor configuration, for example, a restriction becomes unnecessary, that is, the voltage of the main terminal S1 does not have to be higher than the voltage of the main terminal S2. To be specific, the voltage of the main terminal S2 may be higher than the voltage of the main terminal S1. For example, in the case of using an AC power supply of a high voltage that is "−600 to +600 V", the voltage of the main terminal S1 may be "0 V", the voltage VG1 of the control terminal G1 may be "0 to 5 V", the voltage of the main terminal S2 may be "−600 to +600 V", and the voltage of the control terminal G2 may be "Voltage of Main Terminal S2+0 to 5 V". In this case, a voltage VGS1 (=VG1−VS1) of the control terminal G1 based on the voltage of the main terminal S1 is "0 to 5 V", and a voltage VGS2 (=VG2−VS2) of the control terminal G2 based on the voltage of the main terminal S2 is "0 to 5 V". Therefore, the withstand voltage may be the same as the withstand voltage between the gate and source of the conventional FET.

Next, an operation of detecting the forward current in the load drive circuit with the current bidirectional detecting function shown in FIG. 2 will be explained.

The four-terminal field-effect transistor 12 is turned on when the control voltages VG1 and VG2 output from the switch control circuit 4 are applied to the control terminals G1 and G2 of the four-terminal field-effect transistor 12. At this time, the four-terminal field-effect transistor 12 allows the forward current I(MSW1) to flow from the main terminal S1 to the main terminal S2.

The four-terminal field-effect transistor 13 shares the control terminals G1 and G2 with the four-terminal field-effect transistor 12. Therefore, when the forward current I(MSW1) flows through the four-terminal field-effect transistor 12, the forward current I(SSW1) flows from the main terminal S1 to the main terminal S2 in the four-terminal field-effect transistor 13. Here, the differential amplifier 15 operates such that the voltage VGND of the second wire 6 and the node voltage V(SSW1) applied to the inverted input terminal become the same potential as each other. The four-terminal field-effect transistors 12 and 13 share the control terminals G1 and G2 and the main terminal S1, and the potentials of the main terminals S2 of the four-terminal field-effect transistors 12 and 13 become the same as each other. Therefore, the relation between the forward current I(MSW1) flowing through the four-terminal field-effect transistor 12 and the forward current I(SSW1) flowing through the four-terminal field-effect transistor 13 becomes a relation proportional to a transistor size ratio. Here, if the size of the four-terminal field-effect transistor 13 is (1/n1) times the size of the four-terminal field-effect transistor 12, the relation between the forward current I(MSW1) and the forward current I(SSW1) can be shown by the following formula.

$$I(SSW1)=(1/n1) \cdot I(MSW1) \quad (5)$$

Therefore, the forward current detecting circuit 10 can detect the forward current I(SSW1) flowing from the main terminal S2 of the four-terminal field-effect transistor 13 to indirectly detect the forward current I(MSW1) flowing through the four-terminal field-effect transistor 12. Especially, the threshold Ith(SSW1) is set as the forward current I(SSW1). In this case, when the forward current I(MSW1) flowing through the four-terminal field-effect transistor 12 becomes a current value shown by the following formula, the overcurrent protection of the forward direction can be realized.

$$Ith(MSW1)=n1 \cdot Ith(SSW1) \quad (6)$$

Next, an operation of detecting the backward current in the load drive circuit with the current bidirectional detecting function shown in FIG. 2 will be explained.

The four-terminal field-effect transistor 12 is turned on when the control voltages VG1 and VG2 output from the switch control circuit 4 are applied to the control terminals G1 and G2 of the four-terminal field-effect transistor 12. At this time, the four-terminal field-effect transistor 12 allows the backward current I(MSW2) to flow from the main terminal S2 to the main terminal S1.

The four-terminal field-effect transistor 14 shares the control terminals G1 and G2 with the four-terminal field-effect transistor 12. Therefore, when the backward current I(MSW2) flows through the four-terminal field-effect transistor 12, the backward current I(SSW2) flows from the main terminal S2 to the main terminal S1 in the four-terminal field-effect transistor 14. Here, the differential amplifier 17 operates such that the voltage VSW of the first wire 5 and the node voltage V(SSW2) of the inverted input terminal become the same potential as each other by virtual short circuit. The four-terminal field-effect transistors 12 and 14 share the control terminals G1 and G2 and the main terminal S2, and the potentials of the main terminals S1 of the four-terminal field-effect transistors 12 and 14 become the same as each other. Therefore, the relation between the backward current I(MSW2) flowing through the four-terminal field-effect transistor 12 and the backward current I(SSW2) flowing through the four-terminal field-effect transistor 14 becomes a relation proportional to a transistor size ratio. Here, if the size of the four-terminal field-effect transistor 14 is (1/n2) times the size of the four-terminal field-effect transistor 12, the relation between the backward current I(MSW2) and the backward current I(SSW2) is shown by the following formula.

$$I(SSW2)=(1/n2) \cdot I(MSW2) \quad (7)$$

Therefore, the backward current detecting circuit 11 can detect the backward current I(SSW2) flowing from the main terminal S1 of the four-terminal field-effect transistor 14 to indirectly detect the backward current I(MSW2) flowing through the four-terminal field-effect transistor 12. Especially, the threshold Ith(SSW2) is set as the backward current I(SSW2). In this case, when the backward current I(MSW2) flowing through the four-terminal field-effect transistor 12 becomes a current value shown by the following formula, the overcurrent protection of the backward direction can be realized.

$$Ith2(MSW)=n2 \cdot Ith(SSW2) \quad (8)$$

As above, in accordance with Embodiment 1 of the present invention, the currents bidirectionally flowing through the four-terminal field-effect transistor 12 can be detected. Moreover, for example, the thresholds can be set for the currents bidirectionally flowing through the current bidirectional switch 1, and the bidirectional overcurrent protection can be realized.

Embodiment 2

Figure 3:
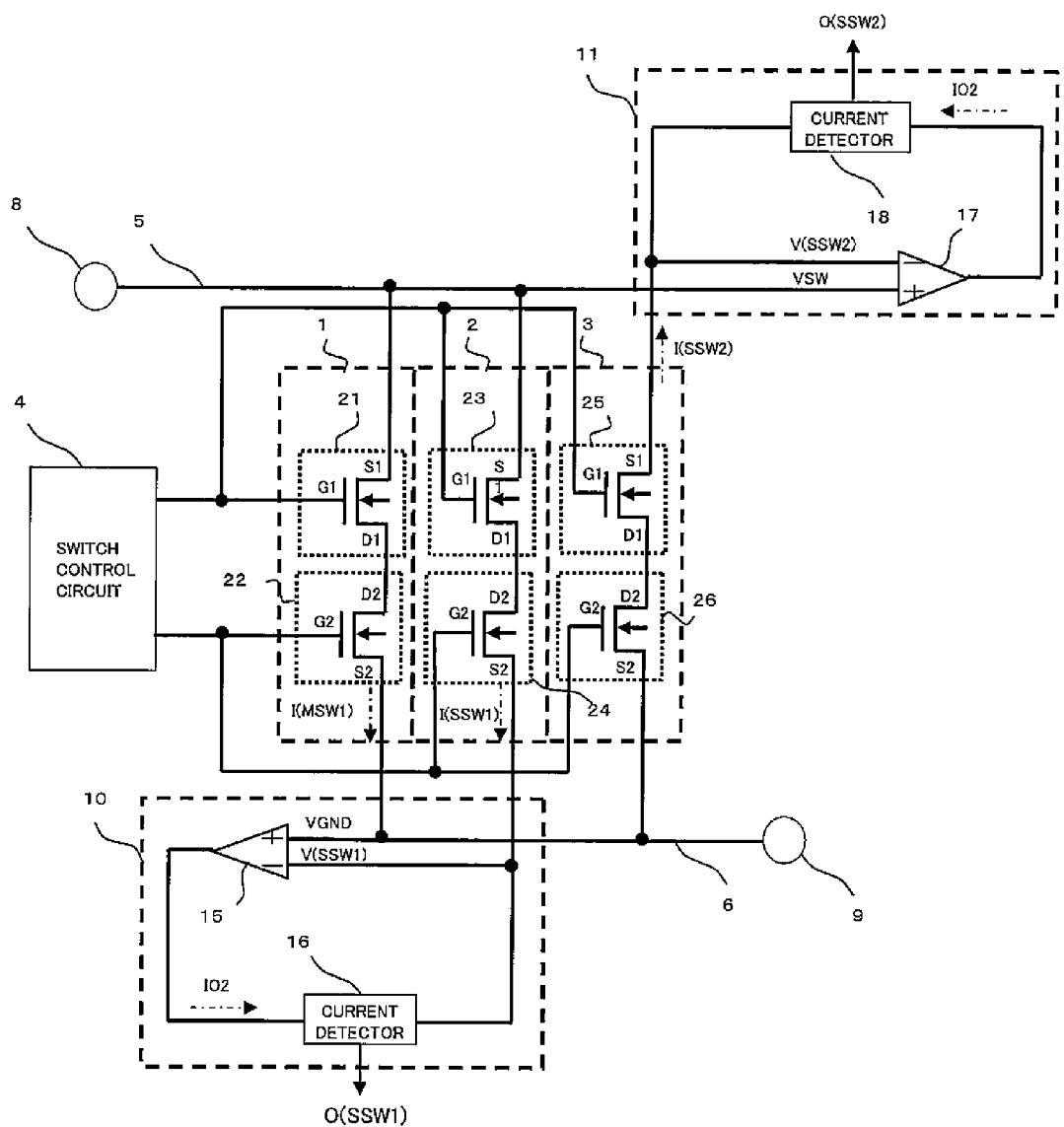
FIG. 3 is a circuit diagram showing the configuration of the load drive circuit with the current bidirectional detecting function according to Embodiment 2 of the present invention.

FIG. 3 is a circuit diagram showing the configuration of the load drive circuit with the current bidirectional detecting function according to Embodiment 2 of the present invention.

Embodiment 2 shown in FIG. 3 is different from Embodiment 1 shown in FIG. 2 in that two three-terminal field-effect transistors serially connected are used in each of the current bidirectional switch 1, the forward current detecting switch 2, and the backward current detecting switch 3.

The current bidirectional switch 1 includes a three-terminal field-effect transistor 21 and a three-terminal field-effect transistor 22. The three-terminal field-effect transistor 21 includes a drain D1 (first main terminal in the present invention), a source S1 (second main terminal in the present invention) connected to the first wire 5, and a gate G1 (single control terminal in the present invention) to which a gate voltage VG1 (first control voltage in the present invention) is applied from the switch control circuit 4. The three-terminal field-effect transistor 22 includes a drain D2 (first main terminal in the present invention) connected to the drain D1, a source S2 (second main terminal in the present invention) connected to the second wire 6, and a gate G2 (single control terminal in the present invention) to which a gate voltage VG2 is applied from the switch control circuit 4.

The forward current detecting switch 2 includes a three-terminal field-effect transistor 23 and a three-terminal field-effect transistor 24. The three-terminal field-effect transistor 23 includes the drain D1 (first main terminal in the present invention), the source S1 (second main terminal in the present invention) connected to the first wire 5, and the gate G1 (single control terminal in the present invention) to which the gate voltage VG1 is applied from the switch control circuit 4. The three-terminal field-effect transistor 24 includes the drain D2 (first main terminal in the present invention) connected to the drain D1, the source S2 (second main terminal in the present invention) connected to the forward current detecting circuit 10, and the gate G2 (single control terminal in the present invention) to which the gate voltage VG2 is applied from the switch control circuit 4.

The backward current detecting switch 3 includes a three-terminal field-effect transistor 25 and a three-terminal field-effect transistor 26. The three-terminal field-effect transistor 25 includes the drain D1 (first main terminal in the present invention), the source S1 (second main terminal in the present invention) connected to the backward current detecting circuit 11, and the gate G1 (single control terminal in the present invention) to which the gate voltage VG1 is applied from the switch control circuit 4. The three-terminal field-effect transistor 26 includes the drain D2 (first main terminal in the present invention) connected to the drain D1, the source S2

(second main terminal in the present invention) connected to the second wire 6, and the gate G2 (single control terminal in the present invention) to which the gate voltage VG2 is applied from the switch control circuit 4.

In a case where a large-current and high-voltage operation is required to drive an AC load, such as the below-described incandescent lamp 30, three-phase motor 34, or the like (in a case where the difference voltage between the voltage VSW of the first wire 5 and the voltage VGND of the second wire 6 is high), each of the three-terminal field-effect transistors 21 and 22 constituting the current bidirectional switch 1 needs to be configured as a high-power switching element (power FET) having low loss (low ON resistance) and high withstand voltage. On this account, it is preferable that each of the three-terminal field-effect transistors 21 and 22 be constituted by a gallium nitride (GaN) transistor. The same is true for the three-terminal field-effect transistors 23 and 24 constituting the forward current detecting switch 2 and the three-terminal field-effect transistors 25 and 26 constituting the backward current detecting switch 3.

Moreover, two control terminals G1 and G2 are provided. In this case, by increasing the distance between the control terminals G1 and G2, the withstand voltage between the control terminals G1 and G2 can be set to be higher than the withstand voltage between the gate and source of the conventional FET. Therefore, unlike the asymmetrical configuration, for example, a restriction becomes unnecessary, that is, the voltage of the main terminal S1 does not have to be higher than the voltage of the main terminal S2. On this account, as with Embodiment 1, the voltage between the main terminal S1 and the main terminal S2 (difference voltage between the voltage VSW of the first wire 5 and the voltage VGND of the second wire 6) can be set to "600 V".

Since the operations of the load drive circuit with the current bidirectional detecting function shown in FIG. 3 are the same as the operations of the load drive circuit with the current bidirectional detecting function shown in FIG. 2, explanations thereof are omitted.

In accordance with Embodiment 2 of the present invention, as with Embodiment 1 of the present invention, the currents bidirectionally flowing through the three-terminal field-effect transistor 21, 22 can be detected. Moreover, for example, the thresholds can be set for the currents bidirectionally flowing through the current bidirectional switch 1, and the bidirectional overcurrent protection can be realized.

Embodiment 3

Figure 4:
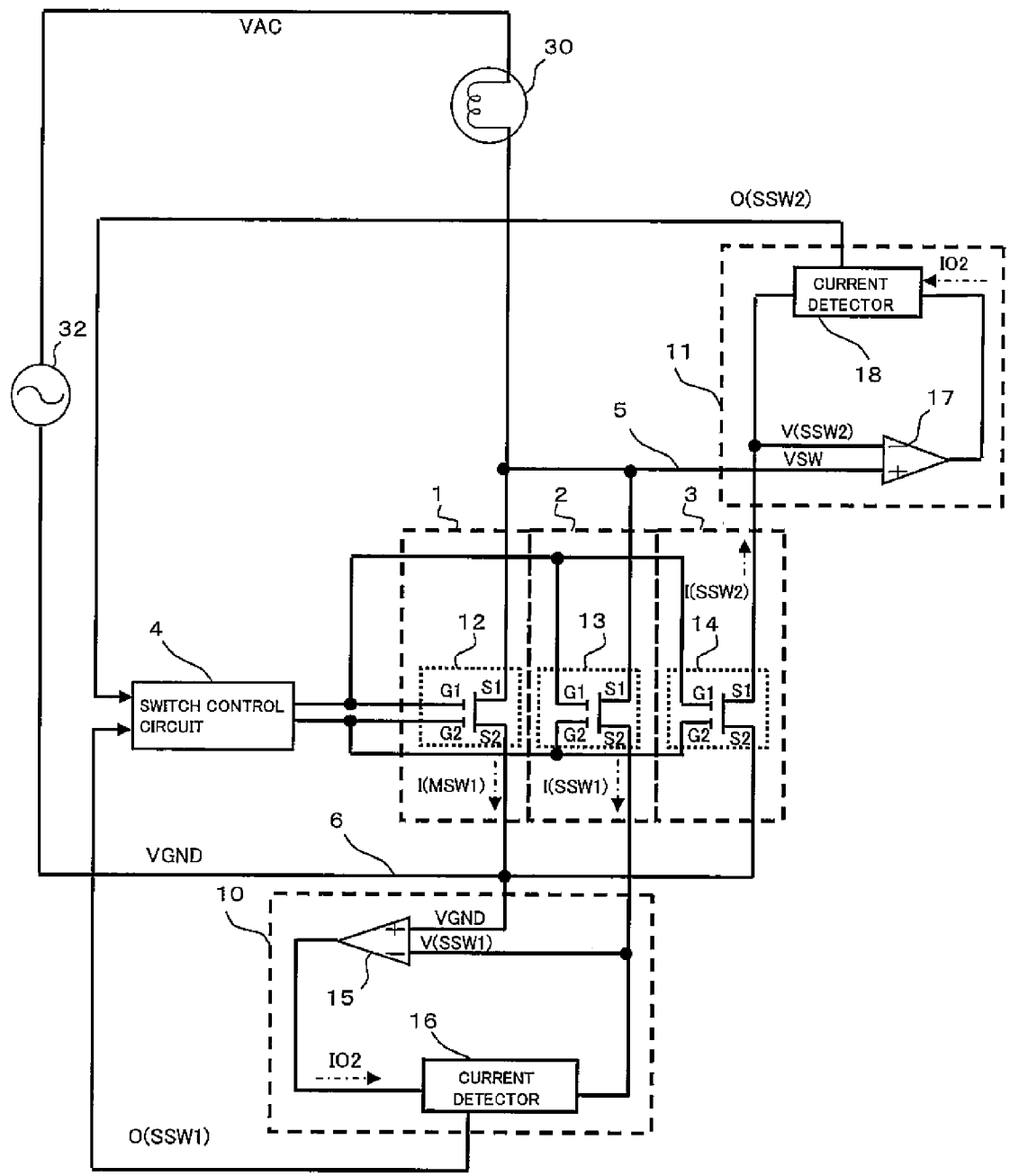
FIG. 4 is a circuit diagram showing the configuration of an incandescent lamp drive circuit according to Embodiment 3 of the present invention.

Embodiment 3 of the present invention shows an application example of the load drive circuit with the current bidirectional detecting function according to each of Embodiments 1 and 2. FIG. 4 is a circuit diagram showing the configuration of an incandescent lamp drive circuit according to Embodiment 3 of the present invention. The following will explain a case where the load drive circuit with the current bidirectional detecting function according to Embodiment 1 of the present invention shown in FIG. 2 is used. However, the load drive circuit with the current bidirectional detecting function according to Embodiment 2 of the present invention shown in FIG. 3 may be used in the same manner.

The incandescent lamp drive circuit shown in FIG. 4 is configured such that a single-phase AC power supply 32 and the incandescent lamp 30 that is an AC load are serially connected between the main terminal S1 and main terminal S2 of the four-terminal field-effect transistor 12 in the load drive circuit with the current bidirectional detecting function shown in FIG. 2. In other words, in the present embodiment, the first wire 5 is connected to the load (incandescent lamp 30), and the second wire 6 is connected to the power supply (single-phase AC power supply 32). The incandescent lamp 30 is turned on when the four-terminal field-effect transistor 12 is turned on, and the incandescent lamp 30 is turned off when the four-terminal field-effect transistor 12 is turned off.

Figure 5:
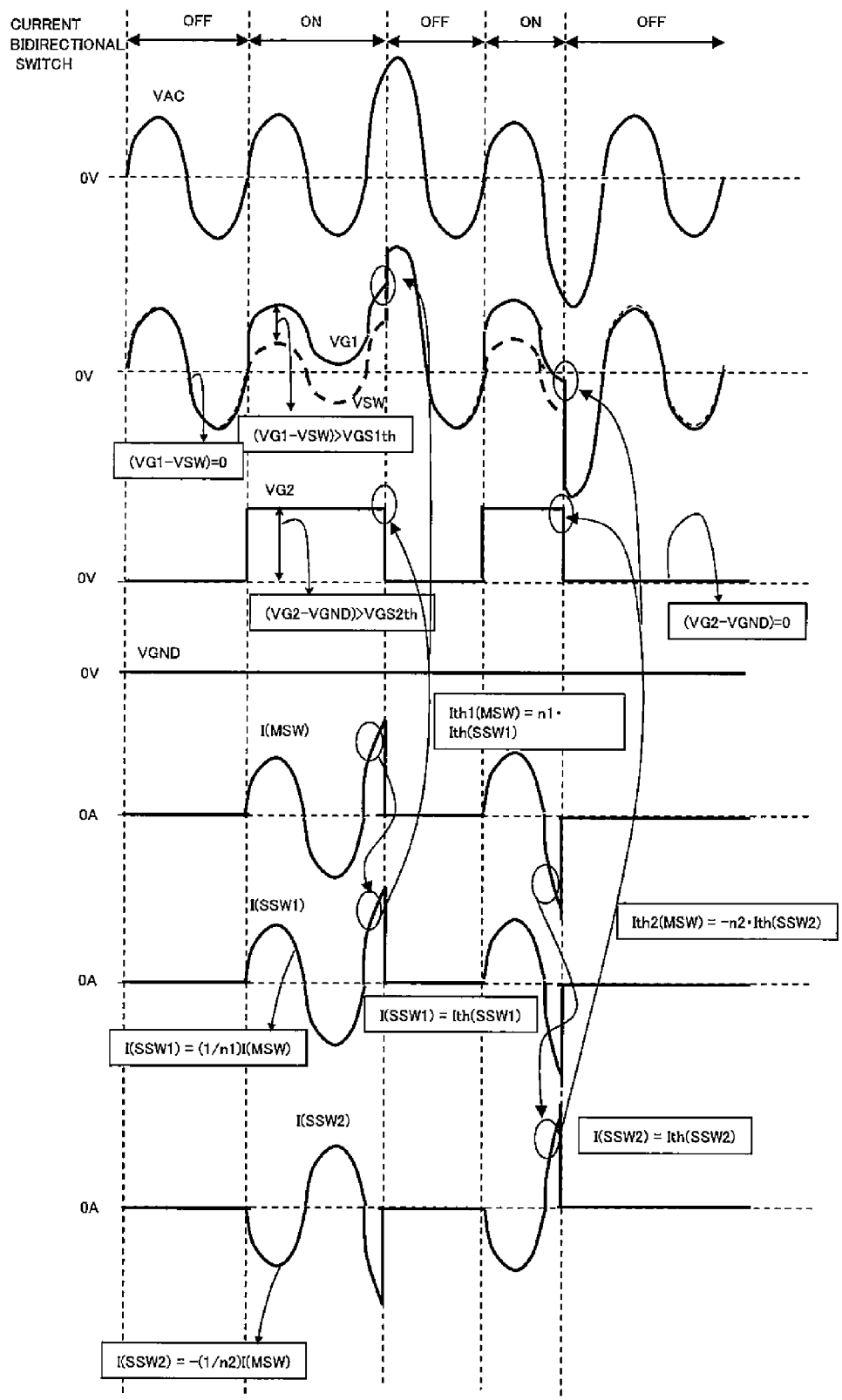
FIG. 5 is a waveform diagram showing operations of the incandescent lamp drive circuit shown in FIG. 4.

FIG. 5 is a waveform diagram showing the operations of the incandescent lamp drive circuit shown in FIG. 4. In FIG. 5, VGND denotes a voltage (which is defined as a ground potential that is 0 V, for convenience of explanation) of a node connected to the main terminal S2 of the four-terminal field-effect transistor 12, VAC denotes a voltage of a node between the single-phase AC power supply 32 and the incandescent lamp 30, VSW denotes a voltage (voltage applied to the non-inverted input terminal of the differential amplifier 17) of a node between the main terminal S1 of the four-terminal field-effect transistor 12 and the incandescent lamp 30, VG1 denotes a control voltage applied to the control terminal G1 of the four-terminal field-effect transistor 12, VG2 denotes a control voltage applied to the control terminal G2 of the four-terminal field-effect transistor 12, VGS1th denotes a threshold of a voltage of the control terminal G1, the voltage being necessary for turning on the control terminal G1 of the four-terminal field-effect transistor 12 and being based on the main terminal S1, and VGS2th denotes a threshold of a voltage of the control terminal G2, the voltage being necessary for turning on the control terminal G2 of the four-terminal field-effect transistor 12 and being based on the main terminal S2. Moreover, I(MSW) denotes the forward current or backward current flowing through the four-terminal field-effect transistor 12, I(SSW1) denotes the forward current flowing through the four-terminal field-effect transistor 13, and I(SSW2) denotes the backward current flowing through the four-terminal field-effect transistor 14.

In the four-terminal field-effect transistor 12, the control voltage VG1 applied to the control terminal G1 and the control voltage VG2 applied to the control terminal G2 are controlled by the switch control circuit 4 in accordance with on/off timings of the four-terminal field-effect transistor 12.

Here, when turning off the entire four-terminal field-effect transistor 12 in actual use, the voltage VGS1 is set to 0 V and the voltage VGS2 is set to 0 V, that is, the potential difference between the main terminal S1 and the control terminal G1 is set to 0 V, and the potential difference between the main terminal S2 and the control terminal G2 is set to 0 V. When the four-terminal field-effect transistor 12 is turned off, the current does not flow through the four-terminal field-effect transistor 12. Therefore, the node voltage VSW between the incandescent lamp 30 and the main terminal S1 of the four-terminal field-effect transistor 12 becomes equal to the voltage VAC of the node between the single-phase AC power supply 32 and the incandescent lamp 30. At this time, the differential amplifier 15 operates such that the voltage V(SSW1) of the main terminal S2 of the four-terminal field-effect transistor 13 and the voltage VGND of the main terminal S2 of the four-terminal field-effect transistor 12 become equal to each other. In the four-terminal field-effect transistors 12 and 13, the control voltages VG1 and VG2 applied to the control terminals G1 and G2 are the same. Therefore, in the four-terminal field-effect transistor 13, the potential difference between the main terminal S1 and the control terminal G1 becomes 0 V, and the potential difference between the main terminal S2 and the control terminal G2 also becomes 0 V. On this account, the current does not flow through the forward current detecting switch 2 (four-terminal field-effect transistor 13). Similarly, the differential amplifier 17 operates such that the voltage V(SSW2) of the main terminal S1 of the four-terminal field-effect transistor 14 of the backward current detecting switch 3 and the voltage VSW of the main terminal S1 of the four-terminal field-effect transistor 12 becomes equal to each other. In the four-terminal field-effect transistors 12 and 14, the control voltages VG1 and VG2 applied to the control terminals G1 and G2 are the same. Therefore, in the four-terminal field-effect transistor 14, the potential difference between the main terminal S1 and the control terminal G1 becomes 0 V, and the potential difference between the main terminal S2 and the control terminal G2 also becomes 0 V. On this account, the current does not flow through the backward current detecting switch 3 (four-terminal field-effect transistor 14).

In contrast, to turn on the entire four-terminal field-effect transistor 12, the control terminals G1 and G2 of the four-terminal field-effect transistor 12 need to be turned on. To be specific, when the four-terminal field-effect transistor 12 is turned on, the voltage VGS1 (=VG1−VSW) of the control terminal G1 based on the main terminal S1 of the four-terminal field-effect transistor 12 needs to be set to the threshold VGS1th or higher, and the control terminal G1 of the four-terminal field-effect transistor 12 needs to be turned on. Similarly, the voltage VGS2 (=VG2−VGND) of the control terminal G2 based on the main terminal S2 of the four-terminal field-effect transistor 12 needs to be set to the threshold VGS2th or higher, and the control terminal G2 of the four-terminal field-effect transistor 12 needs to be turned on. When the four-terminal field-effect transistor 12 is turned on, the node voltage VSW between the incandescent lamp 30 and the main terminal S1 of the four-terminal field-effect transistor 12 becomes a voltage obtained by dividing the single-phase AC voltage VAC of the single-phase AC power supply 32 based on the impedance of the incandescent lamp 30 and the ON resistance of the four-terminal field-effect transistor 12.

When the forward current I(MSW1) flows through the four-terminal field-effect transistor 12, the differential amplifier 15 operates such that the voltage V(SSW1) of the main terminal S2 of the four-terminal field-effect transistor 13 and the voltage VGND of the main terminal S2 of the four-terminal field-effect transistor 12 become the same as each other. In the four-terminal field-effect transistors 12 and 13, the control voltages VG1 and VG2 applied to the control terminals G1 and G2 are the same. Therefore, a current corresponding to a size ratio between the four-terminal field-effect transistor 12 and the four-terminal field-effect transistor 13 flows through the four-terminal field-effect transistor 13. Here, if the size of the four-terminal field-effect transistor 13 is (1/n1) times the size of the four-terminal field-effect transistor 12, the relation between the forward current I(MSW1) and the forward current I(SSW1) is shown by Formula (5). Therefore, the forward current detecting circuit 10 can detect the forward current I(SSW1) flowing from the main terminal S2 of the four-terminal field-effect transistor 13 to indirectly detect the forward current I(MSW1) flowing through the four-terminal field-effect transistor 12. Especially, when the forward current I(MSW1) flowing through the four-terminal field-effect transistor 12 becomes a current value shown by Formula (6), the overcurrent protection of the forward direction is realized, that is, the four-terminal field-effect transistor 12 is forcibly turned off.

When the backward current I(MSW2) flows through the four-terminal field-effect transistor 12, the differential amplifier 17 operates such that the voltage V(SSW2) of the main terminal S1 of the four-terminal field-effect transistor 14 of the backward current detecting switch 3 and the voltage VSW of the main terminal S1 of the four-terminal field-effect transistor 12 become equal to each other. In the four-terminal field-effect transistors 12 and 14, the control voltages VG1 and VG2 applied to the control terminals G1 and G2 are the same. Therefore, a current corresponding to a size ratio between the four-terminal field-effect transistor 12 and the four-terminal field-effect transistor 14 flows through the four-terminal field-effect transistor 14. Here, if the size of the four-terminal field-effect transistor 14 is (1/n2) times the size of the four-terminal field-effect transistor 12, the relation between the backward current I(MSW2) and the backward current I(SSW2) is shown by Formula (7).

Therefore, the backward current detecting circuit 11 can detect the backward current I(SSW2) flowing from the main terminal S1 of the four-terminal field-effect transistor 14 to indirectly detect the backward current I(MSW2) flowing through the four-terminal field-effect transistor 12. Especially, the threshold Ith(SSW2) is set as the backward current I(SSW2). In this case, when the backward current I(MSW2) flowing through the four-terminal field-effect transistor 12 becomes a current value shown by Formula (8), the overcurrent protection of the backward direction is realized, that is, the four-terminal field-effect transistor 12 is forcibly turned off.

Embodiment 4

Figure 6:
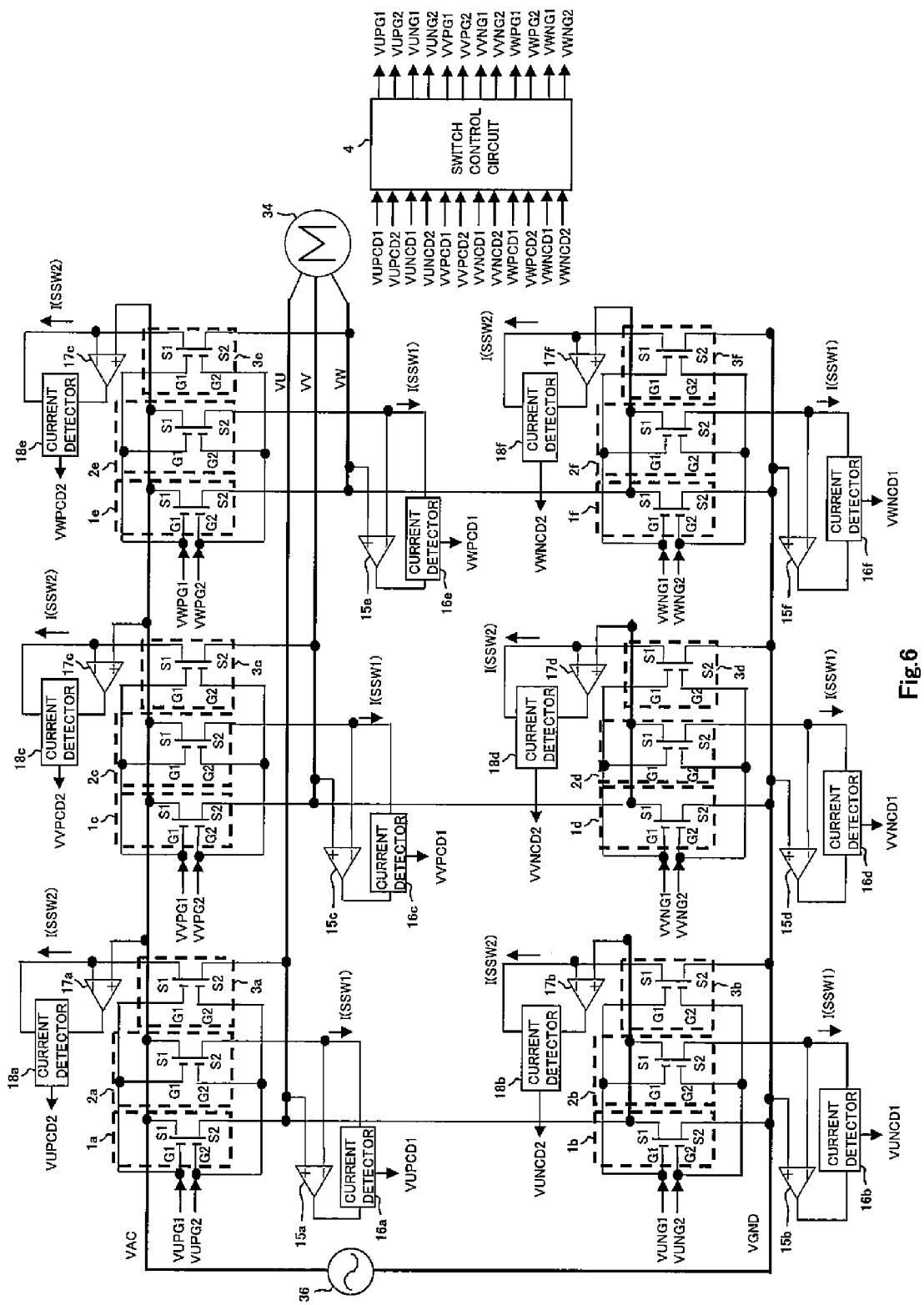
FIG. 6 is a diagram showing the configuration of a matrix converter according to Embodiment 4 of the present invention.

Embodiment 4 of the present invention shows a matrix converter as an application example of the load drive circuit with the current bidirectional detecting function according to each of Embodiments 1 and 2. FIG. 6 is a diagram showing the configuration of the matrix converter according to Embodiment 4 of the present invention. The following will explain a case where the load drive circuit with the current bidirectional detecting function according to Embodiment 1 of the present invention shown in FIG. 2 is used. However, the load drive circuit with the current bidirectional detecting function according to Embodiment 2 of the present invention shown in FIG. 3 may be used in the same manner.

The matrix converter shown in FIG. 6 directly generates a three-phase AC voltage (VU, VV, VW) from a single-phase AC power supply 36 without converting into a DC voltage to drive the three-phase motor 34 that is an AC load. The matrix converter shown in FIG. 6 is configured such that the load drive circuit with the current bidirectional detecting function shown in FIG. 2 is provided for each of high potential sides (UP, VP, WP) and low potential sides (UN, VN, WN) of a U phase, a V phase, and a W phase. To be specific, a pair of a current bidirectional switch 1a of the U-phase high potential side UP and a current bidirectional switch 1b of the U-phase low potential side UN, a pair of a current bidirectional switch 1c of the V-phase high potential side VP and a current bidirectional switch 1d of the V-phase low potential side VN, and a pair of a current bidirectional switch 1e of the W-phase high potential side WP and a current bidirectional switch 1f of the W-phase low potential side WN are connected between a power supply line (VAC) of one of power supply outputs of the single-phase AC power supply 36 and a power supply line (VGND) of the other power supply output. Here, VAC denotes a voltage of a node between the single-phase AC power supply 36 and the main terminal S1 of the high potential side current bidirectional switch (1a, 1c, 1e), and VGND denotes a voltage (which is defined as the ground potential that is 0 V, for convenience of explanation) of a node between the single-phase AC power supply 36 and the main terminal S2 of the low potential side current bidirectional switch (1b, 1d, 1f).

A forward current detecting switch (2a to 2f), a backward current detecting switch (3a to 3f), forward current detecting circuits (15a to 15f, 16a to 16f), and backward current detecting circuits (17a to 17f, 18a to 18f) are provided for each of the current bidirectional switches 1a to 1f. The switch control circuit 4 configured to control the current bidirectional switches (1a to 1f), the forward current detecting switches (2a to 2f), and the backward current detecting switches (3a to 3f) is provided. The switch control circuit 4 outputs the control voltages VG1 and VG2 to the control terminals G1 and G2 of the current bidirectional switches (1a to 1f). Moreover, the switch control circuit 4 receives the outputs of the current detectors (16a to 16f, 18a to 18f).

As above, in the present embodiment, in each of the high potential side load drive circuits, the first wire is connected to the power supply (single-phase AC power supply 36) and the second wire is connected to the load (three-phase motor 34), and in the low potential side load drive circuit, the first wire is connected to the load (three-phase motor 34) and the second wire is connected to the power supply (single-phase AC power supply 36).

The configuration of the matrix converter shown in FIG. 6 will be explained in detail. In the current bidirectional switch 1a, the main terminal S1 is connected to the power supply line (VAC) of one of the power supply outputs of the single-phase AC power supply 36, and the main terminal S2 is connected to the main terminal S1 of the current bidirectional switch 1b and a U-phase power supply line (VU) of the three-phase motor 34. A voltage of a node between the main terminal S2 of the current bidirectional switch 1a and the main terminal S1 of the current bidirectional switch 1b becomes VU applied to the U phase of the three-phase motor 34. In the forward current detecting switch 2a, the main terminal S1 is connected to the power supply line (VAC) of one of the power supply outputs of the single-phase AC power supply 36, and the main terminal S2 is connected to the inverted input terminal of the differential amplifier 15a. In the differential amplifier 15a, the non-inverted input terminal is connected to the U-phase power supply line (VU) of the three-phase motor 34, and the output terminal is connected to the main terminal S2 of the forward current detecting switch 2 via the current detector 16a. In the backward current detecting switch 3a, the main terminal S1 is connected to the inverted input terminal of the differential amplifier 17a, and the main terminal S2 is connected to the U-phase power supply line (VU) of the three-phase motor 34. In the differential amplifier 17a, the non-inverted input terminal is connected to the power supply line (VAC) of one of the power supply outputs of the single-phase AC power supply 36, and the output terminal is connected to the main terminal S1 of the backward current detecting switch 3 via the current detector 18a. Connections regarding a peripheral circuit of each of the current bidirectional switches 1c and 1e are the same as those of the current bidirectional switch 1a.

In contrast, in the current bidirectional switch 1b, the main terminal S1 is connected to the U-phase power supply line (VU) of the three-phase motor 34, and the main terminal S2 is connected to the power supply line (VGND) of the other power supply output of the single-phase AC power supply 36. In the forward current detecting switch 2b, the main terminal S1 is connected to the U-phase power supply line (VU) of the three-phase motor 34, and the main terminal S2 is connected to the inverted input terminal of the differential amplifier 15b. In the differential amplifier 15b, the non-inverted input terminal is connected to the power supply line (VGND) of the other power supply output of the single-phase AC power supply 36, and the output terminal is connected to the main terminal S2 of the forward current detecting switch 2b via the current detector 16b. In the backward current detecting switch 3b, the main terminal S1 is connected to the inverted input terminal of the differential amplifier 17b, and the main terminal S2 is connected to the power supply line (VGND) of the other power supply output of the single-phase AC power supply 36. In the differential amplifier 17b, the non-inverted input terminal is connected to the U-phase power supply line (VU) of the three-phase motor 34, and the output terminal is connected to the main terminal S1 of the backward current detecting switch 3b via the current detector 18b. Connections regarding a peripheral circuit of each of the current bidirectional switches 1d and 1f are the same as those of the current bidirectional switch 1b.

Here, VUPG1 denotes a control voltage applied to the control terminal G1 of the current bidirectional switch 1a, VUPG2 denotes a control voltage applied to the control terminal G2 of the current bidirectional switch 1a, VVPG1 denotes a control voltage applied to the control terminal G1 of the current bidirectional switch 1b, VVPG2 denotes a control voltage applied to the control terminal G2 of the current bidirectional switch 1b, VWPG1 denotes a control voltage applied to the control terminal G1 of the current bidirectional switch 1c, and VWPG2 denotes a control voltage applied to the control terminal G2 of the current bidirectional switch 1c. Moreover, VUNG1 denotes a control voltage applied to the control terminal G1 of the current bidirectional switch 1d, VUNG2 denotes a control voltage applied to the control terminal G2 of the current bidirectional switch 1d, VVNG1 denotes a control voltage applied to the control terminal G1 of the current bidirectional switch 1e, VVNG2 denotes a control voltage applied to the control terminal G2 of the current bidirectional switch 1e, VWNG1 denotes a control voltage applied to the control terminal G1 of the current bidirectional switch 1f, and VWNG2 denotes a control voltage applied to the control terminal G2 of the current bidirectional switch 1f.

Moreover, VUPCD1 denotes an output of the current detector 16a corresponding to the current bidirectional switch 1a, VUPCD2 denotes an output of the current detector 18a corresponding to the current bidirectional switch 1a, VVPCD1 denotes an output of the current detector 16c corresponding to the current bidirectional switch 1c, VVPCD2 denotes an output of the current detector 18c corresponding to the current bidirectional switch 1c, VWPCD1 denotes an output of the current detector 16e corresponding to the current bidirectional switch 1e, and VWPCD2 denotes an output of the current detector 18e corresponding to the current bidirectional switch 1e. Moreover, VUNCD1 denotes an output of the current detector 16b corresponding to the current bidirectional switch 1b, VUNCD2 denotes an output of the current detector 18b of the current bidirectional switch 1b, VVNCD1 denotes an output of the current detector 16d corresponding to the current bidirectional switch 1d, VVNCD2 denotes an output of the current detector 18d corresponding to the current bidirectional switch 1d, VWNCD1 denotes an output of the current detector 16f corresponding to the current bidirectional switch 1f, and VWNCD2 denotes an output of the current detector 18f corresponding to the current bidirectional switch 1f.

Moreover, SWUP denotes the current bidirectional switch 1a provided between the power supply line (VAC) of one of the power supply outputs of the single-phase AC power supply 36 and the U-phase power supply line (VU) of the three-phase motor 34, SWVP denotes the current bidirectional switch 1c provided between the power supply line (VAC) of one of the power supply outputs of the single-phase AC power supply 36 and a V-phase power supply line (VV) of the three-phase motor 34, and SWWP denotes the current bidirectional switch 1e provided between the power supply line (VAC) of one of the power supply outputs of the single-phase AC power supply 36 and a W-phase power supply line (VW) of the three-phase motor 34. Moreover, SWUN denotes the current bidirectional switch 1b provided between the power supply line (VGND) of the other power supply output of the single-phase AC power supply 36 and the U-phase power supply line (VU) of the three-phase motor 34, SWVN denotes the current bidirectional switch 1d provided between the power supply line (VGND) of the other power supply output of the single-phase AC power supply 36 and the V-phase power supply line (VV) of the three-phase motor 34, and SWWN denotes the current bidirectional switch 1f provided between the power supply line (VGND) of the other power supply output of the single-phase AC power supply 36 and the V-phase power supply line (VW) of the three-phase motor 34.

Figure 7:
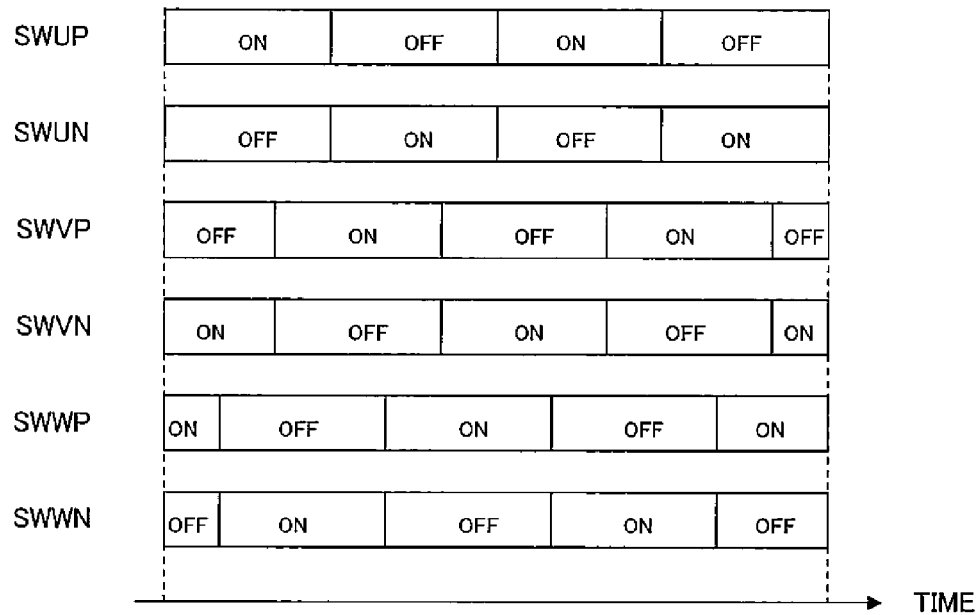
FIG. 7 is a timing chart showing operations of a current bidirectional switch of the matrix converter shown in FIG. 6.
Figure 7:
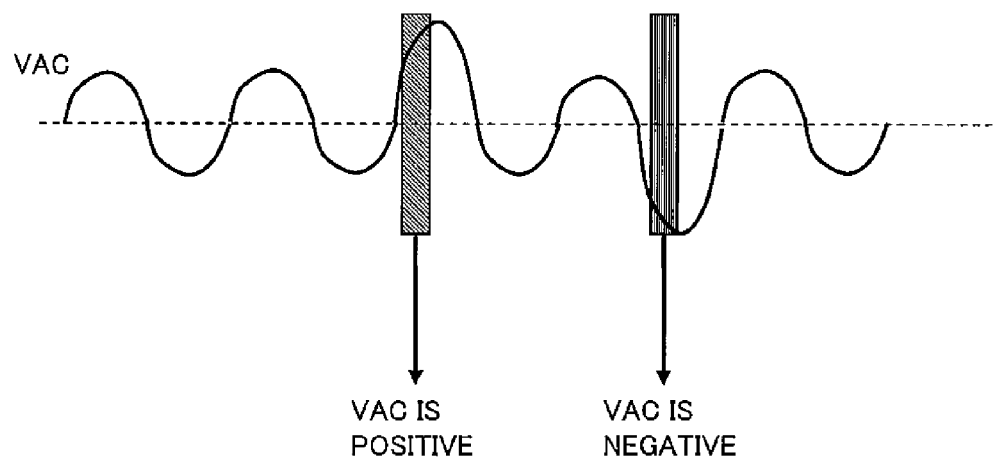

FIG. 7 is a timing chart showing the operations of the current bidirectional switch of the matrix converter shown in FIG. 6. Specifically, FIG. 7 is a diagram showing examples of operations of the current bidirectional switches SWUP, SWUN, SWVP, SWVN, SWWP, and SWWN of the matrix converter configured as above. As shown in FIG. 7, to prevent a through current from flowing by turning on the current bidirectional switches SWUP and SWUN at the same time, the current bidirectional switches SWUP and SWUN are controlled such that when one of the current bidirectional switches SWUP and SWUN is turned on, the other one is turned off. The same is true for the relation between the current bidirectional switches SWVP and SWVN and the relation between the current bidirectional switches SWWP and SWWN.

The frequency of the single-phase AC power supply 36 is several tens of Hz (50 Hz or 60 Hz since it is a commercial power supply input), and each of the operating frequency and three-phase AC output of the matrix converter and is several kHz to several tens of kHz. Therefore, it is thought that in one cycle of the operation of the matrix converter, the voltage of the single-phase AC power supply 36 change little. Here, for ease of explanation, the other power supply output (VGND) of the single-phase AC power supply 36 is regarded as the ground voltage that is 0 V, and a case where one of the power supply outputs (VAC) of the single-phase AC power supply 36 is positive and a case where it is negative will be explained. A waveform diagram showing the operation of the matrix converter when the node voltage VAC is positive is shown in FIG. 8, and a waveform diagram showing the operation of the matrix converter when the node voltage VAC is negative is shown in FIG. 9.

Figure 8:
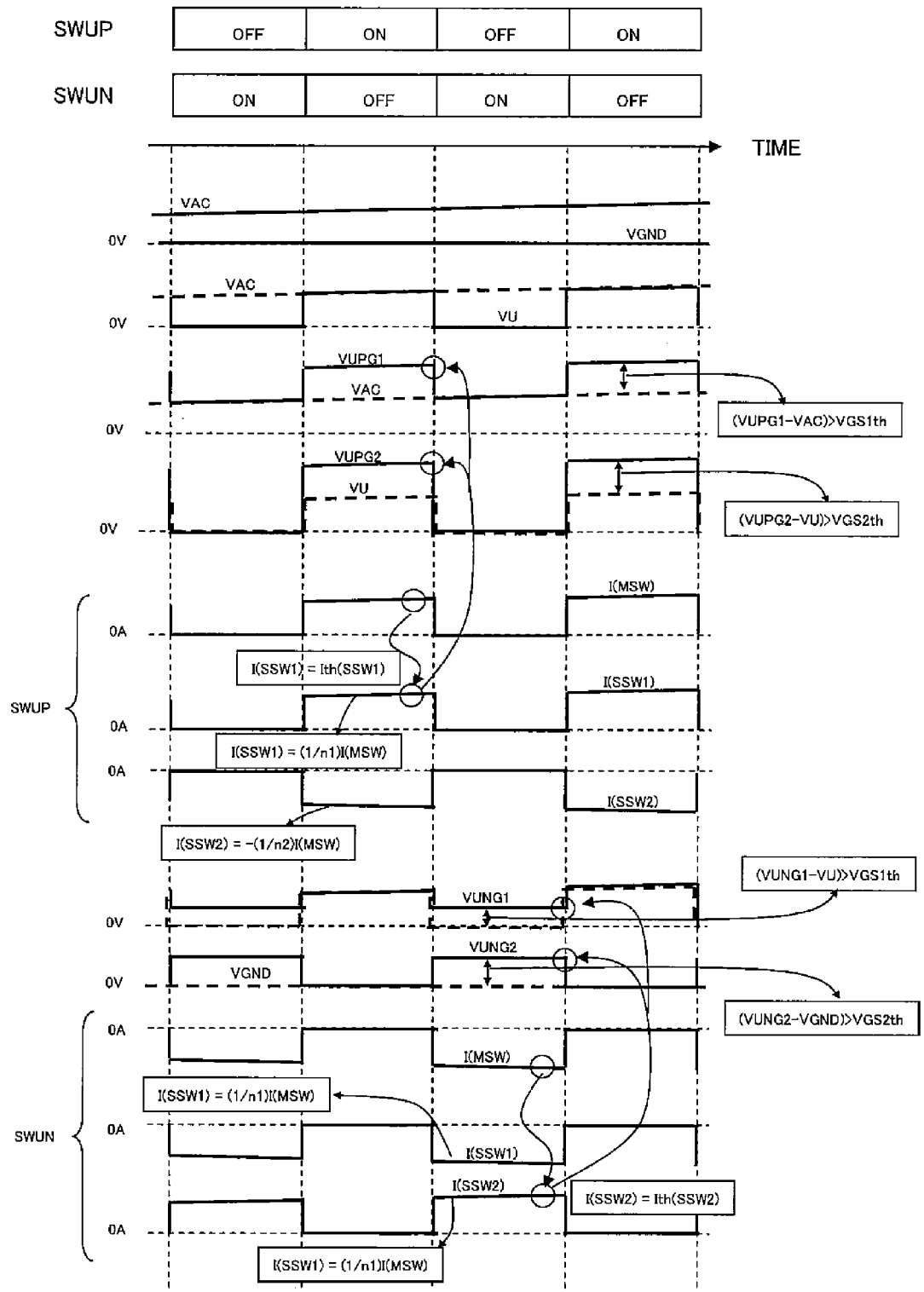
FIG. 8 is a waveform diagram showing operations of the matrix converter when a node voltage VAC is positive.
Figure 9:
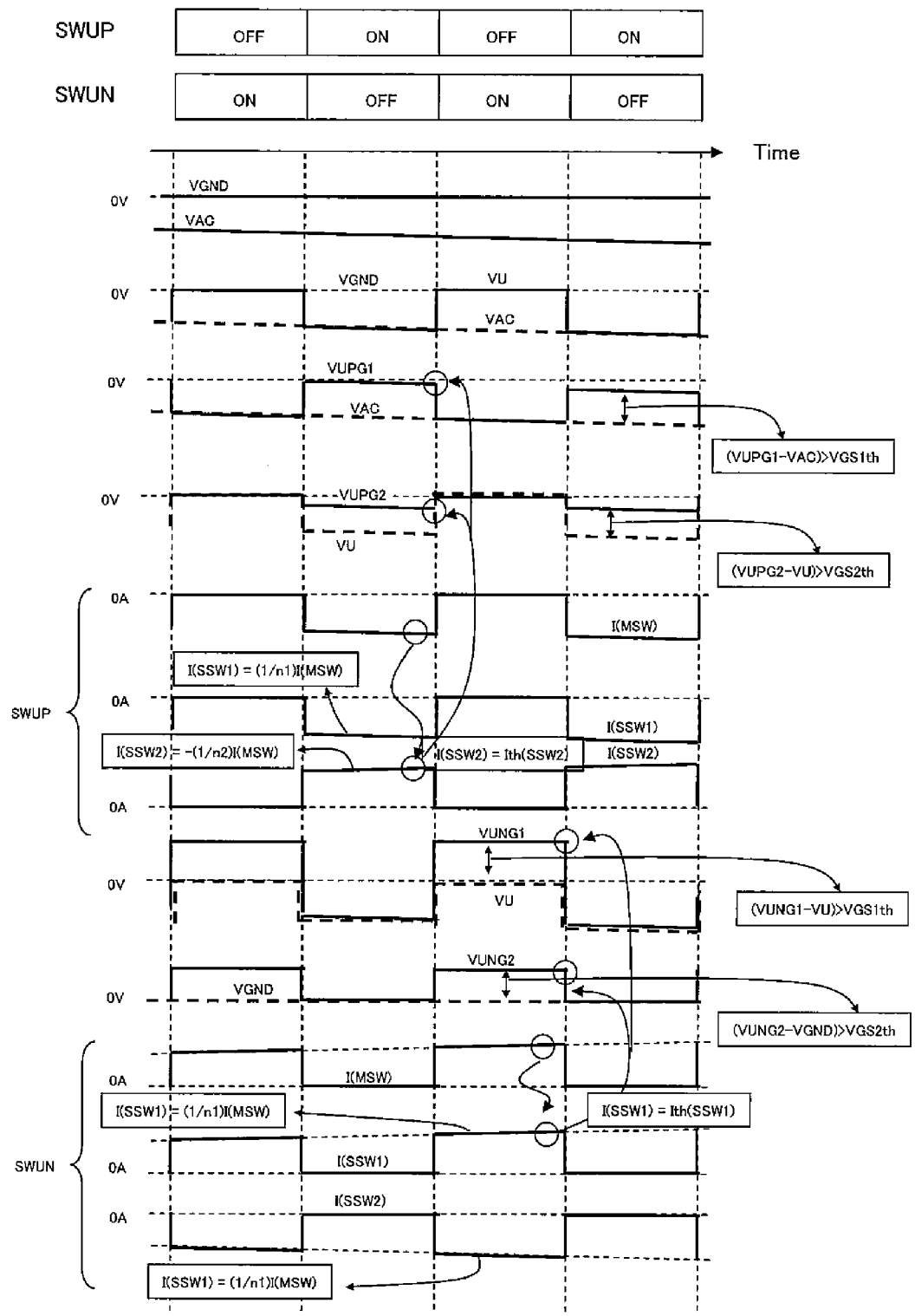
FIG. 9 is a waveform diagram showing operations of the matrix converter when the node voltage VAC is negative.
Figure 10:
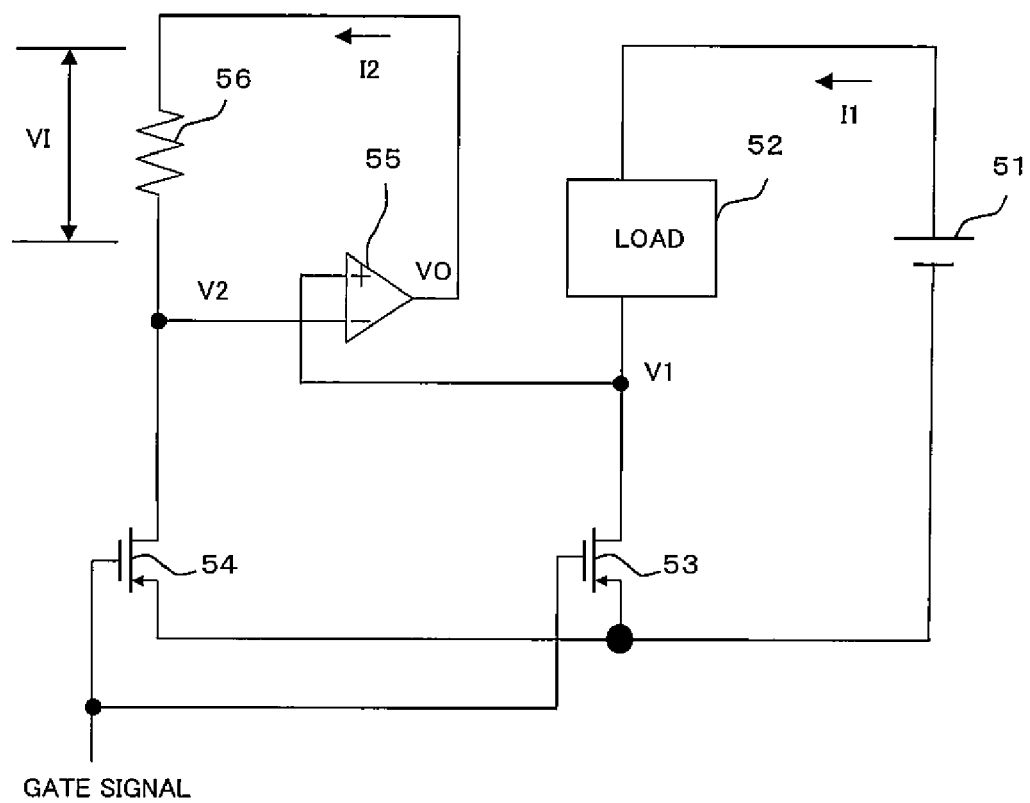
FIG. 10 is a circuit diagram showing the configuration of a conventional load drive circuit with a unidirectional current detecting function.

First, the operation of the matrix converter when the node voltage VAC shown in FIG. 8 is positive will be explained. Hereinafter, the current bidirectional switches SWUP and SWUN connected to the U-phase power supply line of the three-phase motor 34 will be explained. Moreover, the following explanation will be made on the basis that by turning off the current bidirectional switch SWUP in a state where the forward current I(MSW) is flowing from the main terminal S1 to the main terminal S2 in the current bidirectional switch SWUP, the current bidirectional switch SWUN is turned on, and the backward current I(MSW) flows from the main terminal S2 to the main terminal S1 in the current bidirectional switch SWUN. Further, the following explanation will be made on the basis that a case of turning off the current bidirectional switch SWUP in a state where the backward current I(MSW) is flowing denotes a case where the node voltage VAC is negative.

When the current bidirectional switch SWUP is turned on and the current bidirectional switch SWUN is turned off, in the current bidirectional switch SWUP, the voltage VGS1 of the control terminal G1 based on the voltage of the main terminal S1 is controlled so as to become higher than the threshold VGS1th, and the voltage VGS2 of the control terminal G2 based on the voltage of the main terminal S2 is controlled so as to become higher than the threshold VGS2th. Moreover, in the current bidirectional switch SWUN, the voltage VGS1 of the control terminal G1 based on the voltage of the main terminal S1 is controlled so as to become 0 V, and the voltage VGS2 of the control terminal G2 based on the voltage of the main terminal S2 is controlled so as to become 0 V. At this time, the voltage of the U-phase power supply line (VU) of the three-phase motor 34 becomes substantially equal to the node voltage VAC. Moreover, the current detecting circuit on the current bidirectional switch SWUP side operates in the same manner as when the four-terminal field-effect transistor 12 of the incandescent lamp drive circuit is turned on, and the current detecting circuit on the current bidirectional switch SWUN operates in the same manner as when the four-terminal field-effect transistor 12 of the incandescent lamp drive circuit is turned off. To be specific, since the forward current I(MSW) flows from the main terminal S1 to the main terminal S2 in the current bidirectional switch SWUP, the switch control circuit 4 detects the overcurrent when the forward current I(SSW1) flowing from the main terminal S1 to the main terminal S2 in the forward current detecting switch 2a becomes the threshold Ith(SSW1). Then, the switch control circuit 4 forcibly turns off the current bidirectional switch SWUP and forcibly turns on the current bidirectional switch SWUN.

In contrast, when the current bidirectional switch SWUP is turned off and the current bidirectional switch SWUP is turned on, in the current bidirectional switch SWUP, the voltage VGS1 of the control terminal G1 based on the voltage of the main terminal S1 is controlled so as to become 0 V, and the voltage VGS2 of the control terminal G2 based on the voltage of the main terminal S2 is controlled so as to become 0 V. Moreover, in the current bidirectional switch SWUN, the voltage VGS1 of the control terminal G1 based on the voltage of the main terminal S1 is controlled so as to become higher than the threshold VGS1th, and the voltage VGS2 of the control terminal G2 based on the voltage of the main terminal S2 is controlled so as to become higher than the threshold VGS2th. At this time, the voltage of the U-phase power supply line (VU) of the three-phase motor 34 becomes substantially equal to the node voltage VGND. Moreover, the current detecting circuit on the current bidirectional switch SWUP side operates in the same manner as when the four-terminal field-effect transistor 12 of the incandescent lamp drive circuit is turned off, and the current detecting circuit on the current bidirectional switch SWUN side operates in the same manner as when the four-terminal field-effect transistor 12 of the incandescent lamp drive circuit is turned on. Since the backward current I(MSW) flows from the main terminal S2 to the main terminal S1 in the current bidirectional switch SWUN, the switch control circuit 4 detects the overcurrent when the backward current I(SSW2) flowing from the main terminal S2 to the main terminal S1 in the backward current detecting switch 3a becomes the threshold Ith(SSW2). Then, the switch control circuit 4 forcibly turns on the current bidirectional switch SWUP and forcibly turns off the current bidirectional switch SWUN.

Next, the operation of the matrix converter when the node voltage VAC shown in FIG. 9 is negative will be explained. Hereinafter, the current bidirectional switches SWUP and SWUN connected to the U-phase of power supply line of the three-phase motor 34 will be explained. Moreover, the following explanation will be made on the basis that by turning off the current bidirectional switch SWUP in a state where the backward current I(MSW) is flowing from the main terminal S2 to the main terminal S1 in the current bidirectional switch SWUP, the current bidirectional switch SWUN is turned on, and the forward current I(MSW) flows from the main terminal S1 to the main terminal S2 in the current bidirectional switch SWUN. Further, the following explanation will be made on the basis that a case of turning off the current bidirectional switch SWUP in a state where the forward current I(MSW) is flowing denotes a case where the node voltage VAC is positive.

When the current bidirectional switch SWUP is turned on and the current bidirectional switch SWUN is turned off, in the current bidirectional switch SWUP, the voltage VGS1 of the control terminal G1 based on the voltage of the main terminal S1 is controlled so as to become higher than the threshold VGS1th, and the voltage VGS2 of the control terminal G2 based on the voltage of the main terminal S2 is controlled so as to become higher than the threshold VGS2th. Moreover, in the current bidirectional switch SWUN, the voltage VGS1 of the control terminal G1 based on the voltage of the main terminal S1 is controlled so as to become 0 V, and the voltage VGS2 of the control terminal G2 based on the voltage of the main terminal S2 is controlled so as to become 0 V. At this time, the voltage of the U-phase power supply line (VU) of the three-phase motor 34 becomes substantially equal to the node voltage VAC. Moreover, the current detecting circuit on the current bidirectional switch SWUP side operates in the same manner as when the four-terminal field-effect transistor 12 of the incandescent lamp drive circuit is turned on, and the current detecting circuit on the current bidirectional switch SWUN side operates in the same manner as when the four-terminal field-effect transistor 12 of the incandescent lamp drive circuit is turned off. Since the backward current I(MSW) flows from the main terminal S2 to the main terminal S1 in the current bidirectional switch SWUP, the switch control circuit 4 detects the overcurrent when the backward current I(SSW2) flowing through the backward current detecting switch 3a becomes the threshold Ith (SSW2). Then, the switch control circuit 4 forcibly turns off the current bidirectional switch SWUP and forcibly turns on the current bidirectional switch SWUN.

In contrast, when the current bidirectional switch SWUP is turned off and the current bidirectional switch SWUP is turned on, in the current bidirectional switch SWUP, the voltage VGS1 of the control terminal G1 based on the voltage of the main terminal S1 is controlled so as to become 0 V, and the voltage VGS2 of the control terminal G2 based on the voltage of the main terminal S2 is controlled so as to become 0 V. Moreover, in the current bidirectional switch SWUN, the voltage VGS1 of the control terminal G1 based on the voltage of the main terminal S1 is controlled so as to become higher than the threshold VGS1th, and the voltage VGS2 of the control terminal G2 based on the voltage of the main terminal S2 is controlled so as to become higher than the threshold VGS2th. At this time, the voltage of the U-phase power supply line (VU) of the three-phase motor 34 becomes substantially equal to the node voltage VGND. Moreover, the current detecting circuit on the current bidirectional switch SWUP side operates in the same manner as when the four-terminal field-effect transistor 12 of the incandescent lamp drive circuit is turned off, and the current detecting circuit on the current bidirectional switch SWUN side operates in the same manner as when the four-terminal field-effect transistor 12 of the incandescent lamp drive circuit is turned on. Since the forward current I(MSW) flows from the main terminal S1 to the main terminal S2 in the current bidirectional switch SWUN, the switch control circuit 4 detects the overcurrent when the forward current I(SSW1) flowing through the forward current detecting switch 2a becomes the threshold Ith (SSW1). Then, the switch control circuit 4 forcibly turns on the current bidirectional switch SWUP and forcibly turns off the current bidirectional switch SWUN.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the spirit of the present invention.

The load drive circuit with the current bidirectional detecting function including the current bidirectional switch according to the present invention is useful as a load drive circuit, such as an incandescent lamp drive circuit or a matrix converter, applied in a power electronics field.

The invention claimed is:

1. A load drive circuit with a current bidirectional detecting function, the load drive circuit comprising:
    a current bidirectional switch connected between a first wire and a second wire, the first wire being connected to one of a power supply and a load, the second wire being connected to the other one of the power supply and the load, the current bidirectional switch being configured to carry out switching to allow a first forward current or a first backward current to flow therethrough, the first forward current flowing in a forward direction from the first wire to the second wire, the first backward current flowing in a backward direction from the second wire to the first wire;
    a forward current detecting switch which is connected to the first wire and through which a second forward current flows, the second forward current being correlated to the first forward current flowing through the current bidirectional switch;
    a backward current detecting switch which is connected to the second wire and through which a second backward current flows, the second backward current being correlated to the first backward current flowing through the current bidirectional switch;
    a forward current detecting circuit which is connected to the forward current detecting switch and through which the second forward current flowing through the forward current detecting switch flows, the forward current detecting circuit being configured to detect the second forward current;
    a backward current detecting circuit which is connected to the backward current detecting switch and through which the second backward current flowing through the backward current detecting switch flows, the backward current detecting circuit being configured to detect the second backward current; and
    a switch control circuit configured to control the switching of the current bidirectional switch, switching of the forward current detecting switch, and switching of the backward current detecting switch such that the first forward current flowing through the current bidirectional switch and the second forward current flowing through the forward current detecting switch flow at the same time, and the first backward current flowing through the current bidirectional switch and the second backward current flowing through the backward current detecting switch flow at the same time.

2. The load drive circuit according to claim 1, wherein:
the current bidirectional switch is a first four-terminal field-effect transistor including a first main terminal connected to the first wire, a second main terminal connected to the second wire, a first control terminal to which a first control voltage is applied from the switch control circuit, and a second control terminal to which a second control voltage is applied from the switch control circuit;
the forward current detecting switch is a second four-terminal field-effect transistor including a first main terminal connected to the first wire, a second main terminal connected to the forward current detecting circuit, a first control terminal to which the first control voltage is applied from the switch control circuit, and a second control terminal to which the second control voltage is applied from the switch control circuit; and
the backward current detecting switch is a third four-terminal field-effect transistor including a first main terminal connected to the backward current detecting circuit, a second main terminal connected to the second wire, a first control terminal to which the first control voltage is applied from the switch control circuit, and a second control terminal to which the second control voltage is applied from the switch control circuit.

3. The load drive circuit according to claim 1, wherein
the current bidirectional switch includes: a first three-terminal field-effect transistor having a first main terminal, a second main terminal connected to the first wire, and a single control terminal to which a first control voltage is applied from the switch control circuit; and a second three-terminal field-effect transistor having a first main terminal connected to the first main terminal of the first three-terminal field-effect transistor, a second main terminal connected to the second wire, and a single control terminal to which a second control voltage is applied from the switch control circuit,
the forward current detecting switch includes: a third three-terminal field-effect transistor having a first main terminal, a second main terminal connected to the first wire, and a single control terminal to which the first control voltage is applied from the switch control circuit; and a fourth three-terminal field-effect transistor having a first main terminal connected to the first main terminal of the third three-terminal field-effect transistor, a second main terminal connected to the forward current detecting circuit, and a single control terminal to which the second control voltage is applied from the switch control circuit, and
the backward current detecting switch includes: a fifth three-terminal field-effect transistor having a first main terminal, a second main terminal connected to the backward current detecting circuit, and a single control terminal to which the first control voltage is applied from the switch control circuit; and a sixth three-terminal field-effect transistor having a first main terminal connected to the first main terminal of the fifth three-terminal field-effect transistor, a second main terminal connected to the second wire, and a single control terminal to which the second control voltage is applied from the switch control circuit.

4. The load drive circuit according to claim 2, wherein each of the current bidirectional switch, the forward current detecting switch, and the backward current detecting switch is constituted by a gallium nitride (GaN) transistor.

5. The load drive circuit according to claim 1, wherein
the forward current detecting circuit includes: a first differential amplifier having a non-inverted input terminal to which a voltage of the second wire is applied, an inverted input terminal to which a first node voltage between the forward current detecting switch and the forward current detecting circuit is applied, and a first output terminal from which a first output current flows out, the first output current causing the voltage of the second wire and the first node voltage to be equal to each other; and a first current detector provided between the output terminal and inverted input terminal of the first differential amplifier to detect the first output current correlated to the second forward current, and
the backward current detecting circuit includes: a second differential amplifier having a non-inverted input terminal to which a voltage of the first wire is applied, an inverted input terminal to which a second node voltage between the backward current detecting switch and the backward current detecting circuit is applied, and an output terminal from which a second output current flows out, the second output current causing the voltage of the first wire and the second node voltage to be equal to each other; and a second current detector provided between the output terminal and inverted input terminal of the second differential amplifier to detect the second output current correlated to the second backward current.

6. The load drive circuit according to claim 1, wherein a single-phase AC power supply and an incandescent lamp are connected between terminals of the current bidirectional switch.

* * * * *